United States Patent [19]

Reimer

[11] 3,774,140

[45] Nov. 20, 1973

[54] CONNECTORLESS PLUG-IN PRINTED WIRING CARD

[75] Inventor: William A. Reimer, Wheaton, Ill.

[73] Assignee: GTE Automatic Electric Laboratories Incorporated, Northlake, Ill.

[22] Filed: Oct. 24, 1972

[21] Appl. No.: 300,048

[52] U.S. Cl. ............ 339/17 C, 317/101, 339/61 M, 339/95

[51] Int. Cl. .......... H05k 1/02

[58] Field of Search .......... 317/101 C, 101 CC, 317/101 D, 101 DH; 339/17, 18, 75, 103, 107, 93, 174, 176, 95, 99, 14, 97, 210, 206, 192, 195, 196, 159, 61, 66, 65

[56] References Cited

UNITED STATES PATENTS

| | | | |
|---|---|---|---|
| 3,235,830 | 2/1966 | Newton, Jr. | 339/59 M X |
| 3,562,798 | 2/1971 | Bragg, Jr. | 339/17 F |
| 3,492,538 | 1/1970 | Fergusson | 339/17 M X |
| 3,582,865 | 6/1971 | Franck et al. | 339/176 MF X |
| 3,102,767 | 9/1963 | Schneck | 339/176 MP |
| 2,748,321 | 5/1956 | Kamm | 339/17 M X |
| 3,319,216 | 5/1967 | McCullough | 339/17 F |

*Primary Examiner*—Marvin A. Champion
*Assistant Examiner*—Terrell P. Lewis
*Attorney*—K. Mullerheim et al.

[57] ABSTRACT

A printed wiring card assembly in which electronic components can be plugged in to mechanically mount and electrically interconnect into the assembly, including a flexible printed wiring sheet held in resilient contact between a component positioner and ridges on a support base. The positioner includes slots and a guide ramp for guiding the component leads insertable between the positioner and conductive connecting portions on the printed wiring sheet. A layer of resilient material on the ridges urges the conductive connecting portions into resilient contact engagement with the component leads.

8 Claims, 4 Drawing Figures

CONNECTORLESS PLUG-IN PRINTED WIRING CARD

This invention relates to printed wiring cards and more particularly to improved means for mechanically mounting and electrically interconnecting components to printed wiring cards.

Reference may be made to the following U.S. Pat. Nos.: 3,213,404; 3,311,790; 3,079,458; 3,638,162; 3,380,016; 3,582,865; 3,158,421; and 3,533,049.

Printed wiring cards are in general use in the electronic industry and contain a layer of conductive strips forming the signal wiring pattern for a desired circuit or circuits. Electrical circuit components are normally mounted to the cards by soldering the component leads directly to the conductive strips. In some cases standard connector receptacles are soldered to the conductive strips, and the component leads are then inserted into the connector receptacles so as to mechanically mount and interconnect the components to the printed wiring pattern. As an example, standard transistor sockets incorporate pins on one end to be soldered to the conductive strips and a receptacle socket end for plug-in mounting of the transistor element leads. While such connector receptacles enable the associated electronic components to be readily mechanically detached from the printed wiring board and electrically disconnected from the printed signal wiring, from a cost and reliability standpoint, such connector receptacles act to effectively double the number of components per wiring card assembly.

SUMMARY OF THE INVENTION

The present invention is a printed wiring card assembly in which electronic components can be readily mechanically mounted and electrically connected without soldering and without additional connector receptacles. In the preferred embodiment of the invention, electronic components are plugged directly into the printed wiring card assembly and maintained in position by resilient material forcing conductive portions on a flexible printed wiring sheet in intimate mechanical and electrical contact with the component leads. The resilient material is located so as to urge the printed wiring sheet against the flush side of a component positioner and the electronic component leads are insertable between the sheet and the positioner side.

DETAILED DESCRIPTION

Figure 1:
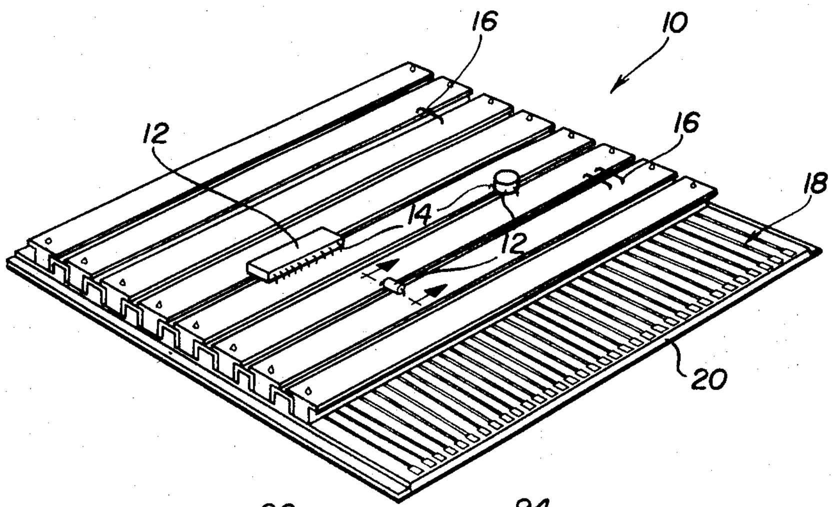
FIG. 1 is a perspective view illustrating a printed wiring card assembly constructed in accordance with the principles of the present invention.

Referring now to FIG. 1, there is illustrated a printed wiring card assembly 10 containing novel means for mounting typical electronic components 12 thereon. As illustrated in the alternative embodiment of FIG. 4, the components may be mounted on both surfaces of the assembly 10. In either case, the components 12 are mechanically mounted to the assembly 10 and electrically connected to the printed wiring assembly by plugging the component leads 14 into the assembly. Conductive wire straps 16 can be utilized for interconnecting various layers of wiring in the assembly 10 as will be described in more detail hereinafter. The internal wiring extends outwardly to a series of connectors 18 on a plug portion 20 to provide electrical connections to the assembly 10.

Figure 2:
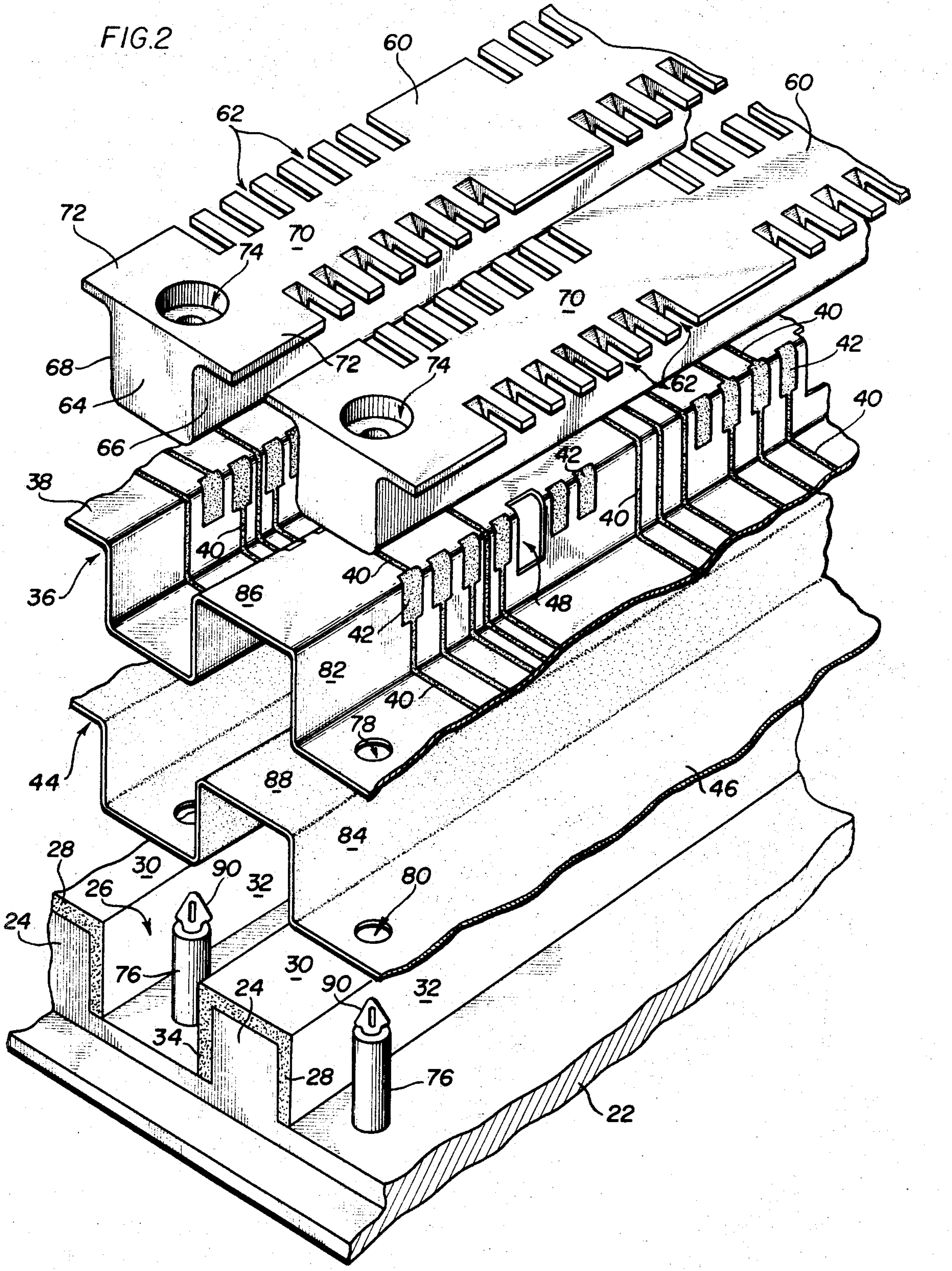
FIG. 2 is an exploded, fragmentary view of the printed wiring card assembly of FIG. 1 showing the construction details.

Referring now to FIG. 2, the exploded view illustrates one side of the printed wiring card assembly 10 of FIG. 1. In particular, a support member 22 of rigid insulating material is formed with a series of alternating inverted C-shaped ridges 24 and cavities 26. A C-shaped thickness of resilient material 28 sized so as to cover the ridge 24 is bonded or cemented to each of the ridges as shown in FIG. 2. The C-shaped resilient material is formed with a top portion 30 and respective depending leg portions 32 and 34 extending along opposite sides of the ridge 24. A flexible printed wiring layer or card 36 is provided by a flexible plastic sheet 38 of for instance, Mylar, having conductive strips 40 bonded thereon. The conductors 40 provide the signal wiring in the assembly.

As can be seen from FIG. 2, a number of the conductors 40 include conductive connector receptacle areas 42 for mounting of the electronic components in the assembly. The conductive connector receptacle areas 42 are each spacially located on the printed wiring card 36 such that when mounted in assembly 10, the connector areas extend along and immediately adjacent to one of the depending leg portions 32 or 34 of the resilient material 28. As may be noted from FIG. 2, the connector receptacle areas provide the normal connector functions such as multiple terminal points for a number of interconnections or a single terminal point for only one component. It is understood that the conductive strips 40 extend to the plug portion 20 shown in FIG. 1 in order that the internal signal wiring may be interconnected with standard available package connectors to the remaining circuits in the electronic system.

A flexible plastic sheet 44 of for instance, Mylar, contains a layer 46 of copper bonded thereto and is located between the resilient members 28 and the printed wiring card 36. The sheet 44 acts as a ground plane to shield the assembly from undesired extraneous signals and also serves as a reference electrical ground in the system. Component connection to the ground sheet 44 can be made through an open area such as aperture 48 in printed wiring card 36 located adjacent to the conductive receptacle areas 42. A component lead inserted downwardly through the open area 48 can therefore electrically contact the ground plane 44.

It is understood of course that instead of the ground sheet 44, a printed wiring card similar to card 36 may be provided below card 36 and components may be mounted in the assembly so as to electrically contact the lower printed wiring card through open area 48 in the upper card 36.

A plurality of component positioners 60 are provided for establishing and maintaining the sheets 36 and 44 in position. Each of the component positioners 60 includes a series of mounting slots 62 through which can be mounted the electronic components in the assembly. The component positioners 60 are formed of a hard plastic material so as to have a smaller width base 64 sized to fit within the C-shaped cavities 26 with opposite surfaces 66 and 68 lying in close proximity to the depending legs 32 and 34 of the resilient material. The resilient material thus urges the sheet 36 and 44 against the sides 66, 68 of positioner 60. In addition, the component positioner 60 includes a table-top portion 70 having extending leaf portions 72 extending beyond the sides 66 and 68. Each of the positioners 60 also includes a mounting hole 74 at each end thereof for positionally engaging a locator pin 76 extending upwardly from support 22.

In construction, one or more of the printed wiring cards 36 with the conductive strips 40 and connector receptacle areas 42 is provided along with a flexible ground plane 44 if desired. As shown in FIG. 2, the card 36 and the ground plane 44 are each provided with mounting apertures 78 and 80 respectively spaced on the flat sheets so that when mounted in the assembly the holes 78 and 80 engage with respective locator pins 76 in the assembly. In assembly, the printed wiring card 36 and ground plane sheet 44 are placed with the mounting holes 78 and 80 engaging respective locator pins 76. When the layers 36 and 40 are placed over the support 22, respective portions thereof are similarly shaped to the resilient material and the cavities 26. In other words, portion 82 of card 36 will lie immediately next to portion 84 on sheet 44 and both of the aforementioned portions will lie immediately adjacent leg 32 of the resilient material 28. Similarly, top portion 86 of card 36 will lie immediately over top portion 88 of sheet 44 and both of the aforementioned portions will lie immediately adjacent leg 32 of the resilient material 28. Similarly, top portion 86 of card 36 will lie immediately over top portion 88 of sheet 44 and both of the aforementioned portions will lie immediately above top 30 of the resilient material.

The component positioners 60 when mounted with mounting holes 74 on the locator pins 76 maintain the card 36 and sheet 44 in position in the assembly with the resilient material resiliently urging the flexible layers 36, 40 against the positioner sides. A locking head portion 90 maintains the component positioners locked in position in the assembly.

Figure 3:
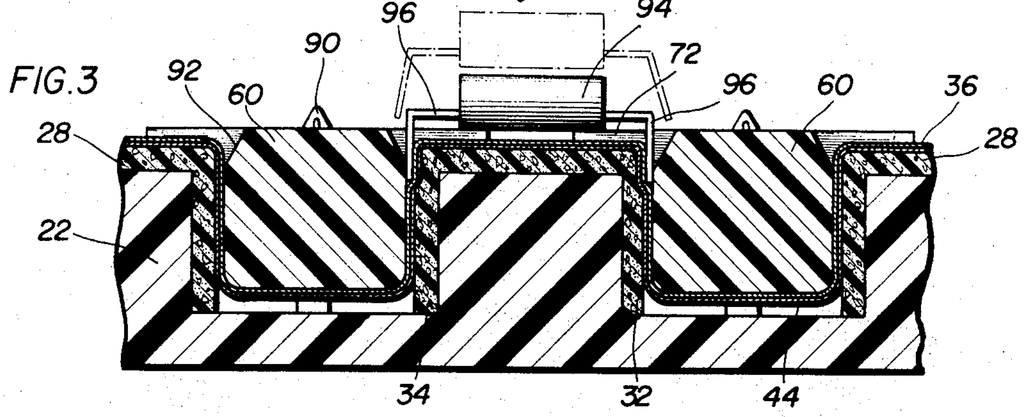
FIG. 3 is a partial sectional view taken along the section lines shown in FIG. 1, illustrating a component in position on the printed wiring card assembly.

Referring to FIG. 2 and the sectional view of FIG. 3 it can be seen that the extending leafs 72 extend beyond the cavity 26 to cover a portion of the top portions 86 of the printed wiring card. This not only maintains the top portions of the wiring card down in position in the assembly above the resilient material, but also maintains a slight distance between the bottom of any component and the component and the conductive strips 40 thereon to prevent any possible undesired shorting of the component body to the conductive strips 40.

As is shown in FIGS. 2 and 3 each of the mounting slots 62 includes a slanted portion 92 which projects angularly from the top 70 of positioner 60 towards respective positioner sides 66 and 68. Plugging of components into the assembly is illustrated in FIG. 3. The electronic component 94, for instance, includes leads 96 which are normally "under sprung" when formed as shown in the dashed line illustration of FIG. 3 prior to insertion of the leads. As the component leads 96 are inserted into the mounting slot 62, the leads 96 are directed by the downwardly depending angular portions 92 so as to force the leads between the wiring card 36 and the component positioner 60 at the conductor receptacle areas 42. It may be noted that the resilient material legs 32 and 34 are depressed at the immediate location of the conductor receptacle areas 42 such that a resilient contact force is provided to press the conductor component leads 96 against the positioner sides 66 or 68 respectively. The component leads are thus maintained in mechanical engagement and electrical interconnection between the positioner sides and the wiring card. The resilient legs 32 and 34 can be formed of any elastomeric type material such as foam silicone rubber, polyurethane foam, etc. having a resiliency sufficient to enable the component leads to be readily inserted into the assembly and maintained therein with a resilient contact force.

It is understood of course that if electrical connection is to be made with the ground plane sheet 44, the component leads inserted through, for instance, open areas 48 on the printed wiring card 36 will be in mounting engagement and electrical connection between the ground sheet 44 and the positioner sides.

Figure 4:
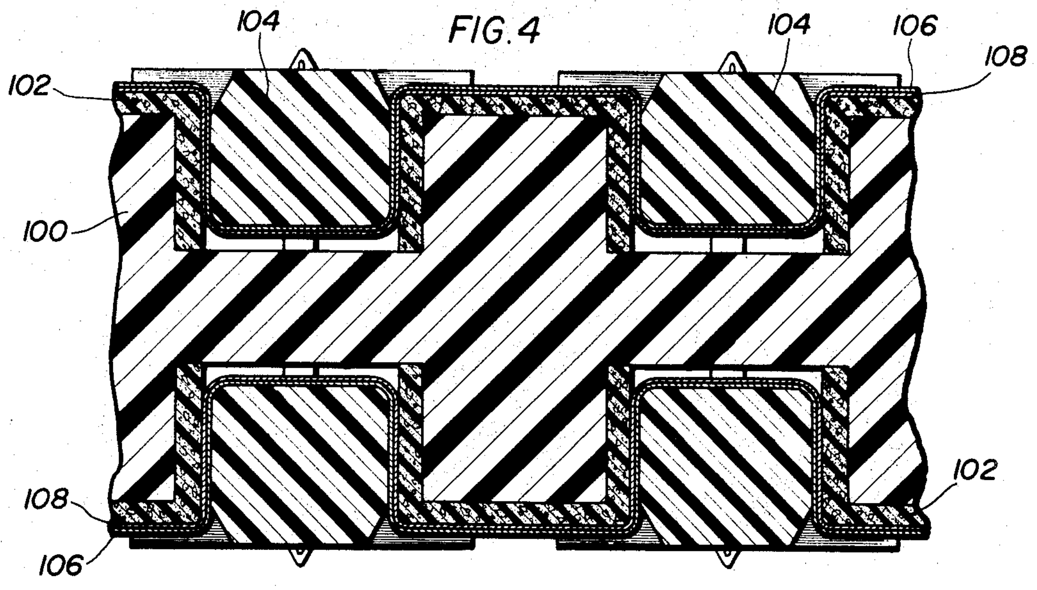
FIG. 4 is a partial sectional view of a double sided printed wiring card assembly.

It is to be realized that many variations can be devised to utilize the principles of the present invention in accordance with the teachings herein. For instance, the printed wiring card(s) placed in the assembly may be single sided, double sided, or multi-layer. In this approach, wire straps, such as the straps 16 shown in FIG. 1, added at unused component mounting slots 62 in the component position 60, can be used to form double sided or multi-layer cards from single sided cards. An example of a double sided assembly is shown in FIG. 4 in which a support member 100 has alternate ridges and cavities on both sides thereof, and includes thereon like components as resilient material 102, positioners 104, printed wiring flexible card 106, and ground plane 108.

In any of the various embodiments, the principles of the present invention provide a printed wiring card assembly wherein the electronic components are pluggable for both mechanical and electrical interconnections, and if a printed wiring card must be changed, only the layer requiring the change need be replaced. This can easily be accomplished because, in reality, the printed wiring layers are also individually pluggable. In addition, although the present invention has been described in connection with electronic components mounted on a printed wiring card, it is also possible to form wiring and connector receptacles on control panels by utilizing the principles of this invention.

The foregoing detailed description has been given for clearness of understanding only, and no unnecessary limitations should be understood therefrom as modiciations will be obvious to those skilled in the art.

What is claimed is:

1. An electronic printed wiring card assembly for mounting and electrically interconnecting electronic components comprising:

a support base card having alternating spacially separated longitudinal ridges and cavities on at least one surface thereof;

a layer of resilient material attached to each of said ridges on said base card;

a flexible printed wiring sheet extending over said ridges and into said cavities on said base card;

conductive strips on one surface of said flexible sheet defining an electrical wiring pattern;

said conductive strips including connector receptacle portions immediately adjacent said ridges; and a plurality of positioner members each overlying said flexible sheet in respective cavities;

said positioner members each sized to define a resilient contact engagement urged by said resilient member between said connector receptacle portions and said positioner member along a surface junction therebetween for electrically connecting said electronic components to said connector receptacle portions and mechanically mounting said components upon insertion of said electronic components in said assembly.

2. A printed wiring card assembly as claimed in claim 1, wherein said positioner members each include slot means extending to said surface junction for receivingly guiding said electronic components pluggable into said assembly at said surface junction.

3. A printed wiring card assembly as claimed in claim 2, wherein each of said slot means includes a ramp depending angularly downwardly from the top of said positioner member to the side thereof immediately adjacent said surface junction.

4. A printed wiring card assembly as claimed in claim 1, wherein each of said positioner members includes respective leaf portions extending transversely to said cavity and overlying a portion of said printed wiring sheet on the adjacent ridge.

5. A printed wiring card assembly as claimed in claim 1, including a flexible conductive sheet mounted immediately beneath said printed wiring sheet on said assembly.

6. A printed wiring card assembly as claimed in claim 5, wherein said flexible conductive sheet includes a conductive layer on at least one surface thereof to provide a ground plane for said assembly.

7. A printed wiring card assembly as claimed in claim 5, wherein said flexible printed wiring sheet includes an aperture adjacent said conductor receptacle portions, said components upon insertion through said aperture resiliently engaging said conductive sheet below said printed wiring sheet.

8. A printed wiring card assembly as claimed in claim 1, wherein said support base includes a plurality of said ridges and cavities on each side of said support base, and further including a symmetrical configuration of said resilient material, printed wiring sheet, and positioner members on each side of said support base for mounting said electronic components on each side thereof.

* * * * *